(12) United States Patent
Nagashima et al.

(10) Patent No.: US 9,543,310 B2
(45) Date of Patent: Jan. 10, 2017

(54) SEMICONDUCTOR STORAGE DEVICE HAVING COMMUNICATED AIR GAPS BETWEEN ADJACENT MEMORY CELLS

(71) Applicant: KABUSHIKI KAISHA TOSHIBA, Minato-ku (JP)

(72) Inventors: Satoshi Nagashima, Yokkaichi (JP); Takehiro Kondoh, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 46 days.

(21) Appl. No.: 14/574,549

(22) Filed: Dec. 18, 2014

(65) Prior Publication Data

US 2016/0071856 A1    Mar. 10, 2016

Related U.S. Application Data

(60) Provisional application No. 62/048,632, filed on Sep. 10, 2014.

(51) Int. Cl.
*H01L 27/115* (2006.01)
*H01L 29/06* (2006.01)
*H01L 21/764* (2006.01)

(52) U.S. Cl.
CPC ....... *H01L 27/11524* (2013.01); *H01L 21/764* (2013.01); *H01L 27/1157* (2013.01); *H01L 27/11548* (2013.01); *H01L 27/11575* (2013.01); *H01L 29/0649* (2013.01)

(58) Field of Classification Search
CPC ............ H01L 27/11524; H01L 27/1157; H01L 27/1052; H01L 27/10; H01L 27/105; H01L 21/764; H01L 29/0649
See application file for complete search history.

(56) References Cited

U.S. PATENT DOCUMENTS

| 7,598,114 B2 | 10/2009 | Li et al. |
| 2006/0001073 A1 | 1/2006 | Chen et al. |
| 2006/0231884 A1 | 10/2006 | Yonemochi et al. |
| 2009/0127613 A1 | 5/2009 | Ikehashi |
| 2010/0148237 A1* | 6/2010 | Kito ................ H01L 27/11551 257/315 |
| 2013/0168756 A1* | 7/2013 | Hopkins .......... H01L 27/11524 257/324 |

FOREIGN PATENT DOCUMENTS

| JP | 11-97535 | 4/1999 |
| JP | 2009-129981 | 6/2009 |

OTHER PUBLICATIONS

R. Arghavani, et al., "Strain Engineering to Improve Data Retention Time in Nonvolatile Memory", IEEE Transactions on Electron Devices, vol. 54, No. 2, Feb. 2007, pp. 362-365.
R. Daamen, et al., "Multi-Level Air Gap Integration for 32/22nm nodes using a Spin-on Thermal Degradable Polymer and a SiOC CVD Hard Mask", IEEE International Interconnect Technology Conference, 2007, pp. 61-63.

* cited by examiner

*Primary Examiner* — Charles Garber
*Assistant Examiner* — Brigitte Paterson
(74) *Attorney, Agent, or Firm* — Oblon, McClelland, Maier & Neustadt, L.L.P.

(57) ABSTRACT

A semiconductor storage device according to an embodiment of the invention includes a semiconductor substrate and a plurality of memory cells on the semiconductor substrate. A first film is provided above the memory cells to form air gaps above a memory string in which the memory cells are connected in series.

6 Claims, 5 Drawing Sheets

SEMICONDUCTOR STORAGE DEVICE HAVING COMMUNICATED AIR GAPS BETWEEN ADJACENT MEMORY CELLS

CROSS REFERENCE TO RELATED APPLICATIONS

This application is based upon and claims the benefit of priority from the prior U.S. Provisional Patent Application No. 62/048,632, filed on Sep. 10, 2014, the entire contents of which are incorporated herein by reference.

FIELD

The embodiments of the present invention relate to a semiconductor storage device and manufacturing method thereof.

BACKGROUND

For downscaling and high integration of a semiconductor storage device such as a NAND flash memory, the width of word lines (control gates) or the interval between adjacent ones of the word lines has been narrowed. When the interval between adjacent ones of the word lines is narrowed, a dielectric breakdown or a leak current may occur between the adjacent ones of the word lines. To suppress the dielectric breakdown or the leak current, provision of an air gap (a hollow) between adjacent ones of the word lines is considered. Because a relative permittivity of the air gap (that is, air) is lower than that of an insulating film such as a silicon dioxide film, the air gap between adjacent ones of the word lines can reduce a parasitic capacitance between the adjacent ones of the word lines and enhance the withstanding pressure between the adjacent ones of the word lines.

However, when an insulating film is formed on the word lines, the insulating film is shrunk by heat treatment or the like and pulls the word lines to apply a tensile stress to the word lines. Therefore, when an air gap is provided between adjacent ones of the word lines, the word lines are curved due to the tensile stress. When the word lines are curved, charge retention properties of memory cells corresponding to the word lines are deteriorated.

For example, when an air gap is provided between adjacent ones of memory cells in a memory string, memory cells on both ends of the memory string are pulled by an insulating film on the memory string toward the center of the memory string. In this case, charge retention properties of the memory cells on the both ends of the memory string are deteriorated.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction.

A semiconductor storage device according to an embodiment includes a semiconductor substrate and a plurality of memory cells on the semiconductor substrate. A first film is provided above the memory cells to form air gaps above a memory string in which the memory cells are connected in series.

Figure 1:
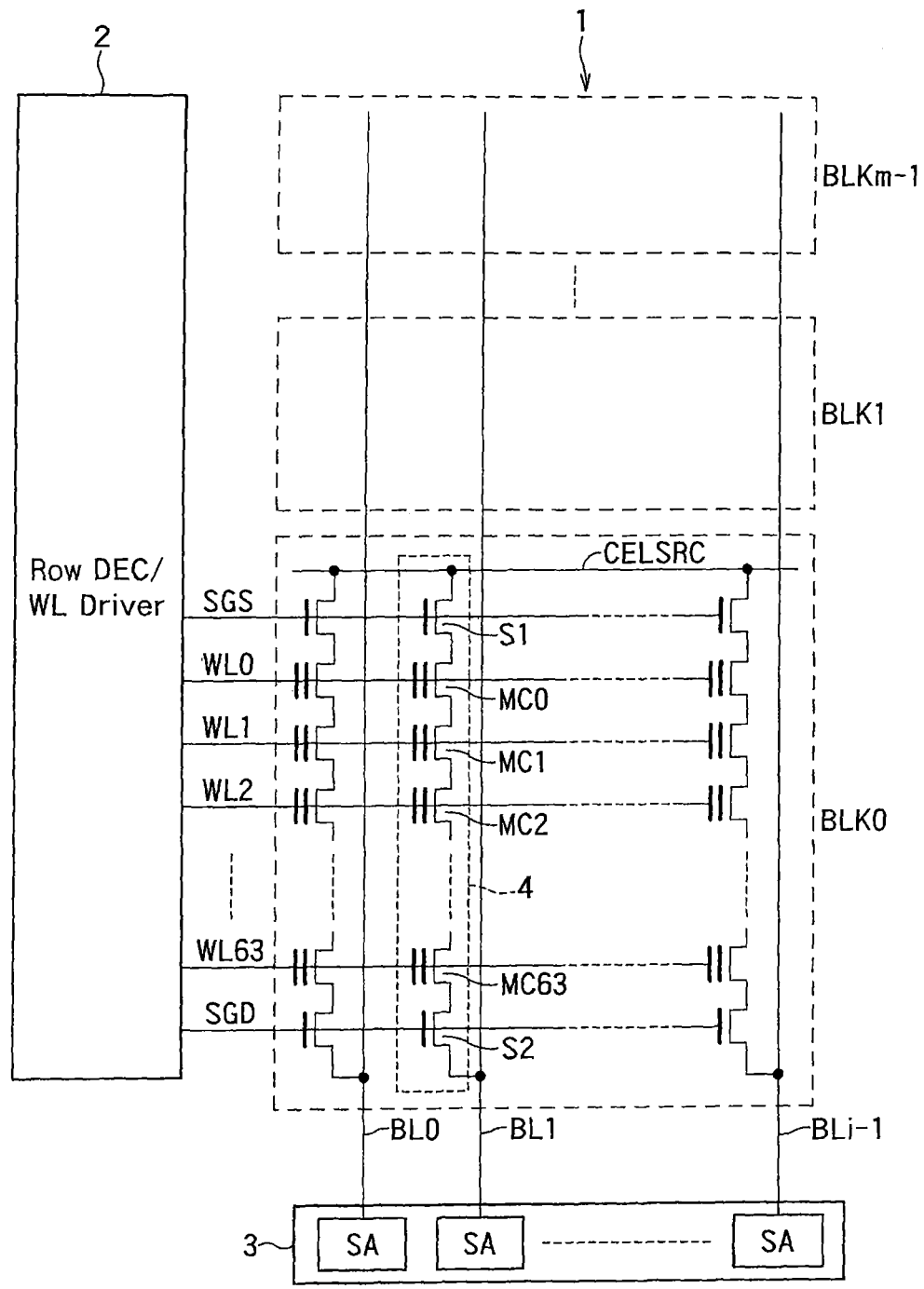
FIG. 1 shows a specific configuration of a cell array 1.

FIG. 1 shows a specific configuration of a cell array 1. In this example, NAND cell units (memory strings) 4 each include 64 memory cells MC0 to MC63 connected in series. Select gate transistors S1 and S2 are connected at both ends of the memory string 4, respectively. Sources of the select gate transistors S1 are connected to a common source line CELSRC and drains of the select gate transistors S2 are connected to bit lines BL (BL0 to BLi−1), respectively. The bit lines BL can be electrically connected to the memory cells MC in the memory strings 4 via the corresponding select gate transistors S2, respectively. Control gates of the memory cells MC0 to MC63 are connected to word lines WL (WL0 to WL63), respectively, and gates of the select gate transistors S1 and S2 are connected to select gate lines SGS and SGD, respectively.

A range of a plurality of the memory cells MC along one word line WL is a page as a unit of batch data read or batch data write. A range of a plurality of the memory strings 4 arranged in a direction of the word line WL constitutes a cell block BLK as a unit of batch data erase. In FIG. 1, a plurality of cell blocks BLK0 to BLKm−1 that share the bit lines BL are arrayed in a direction of the bit lines BL to form the cell array 1. The word lines WL and the select gate lines SGS and SGD are driven by a row decoder 2. The bit lines BL are connected to sense amplifier circuits SA in a page buffer 3, respectively.

Figure 2:
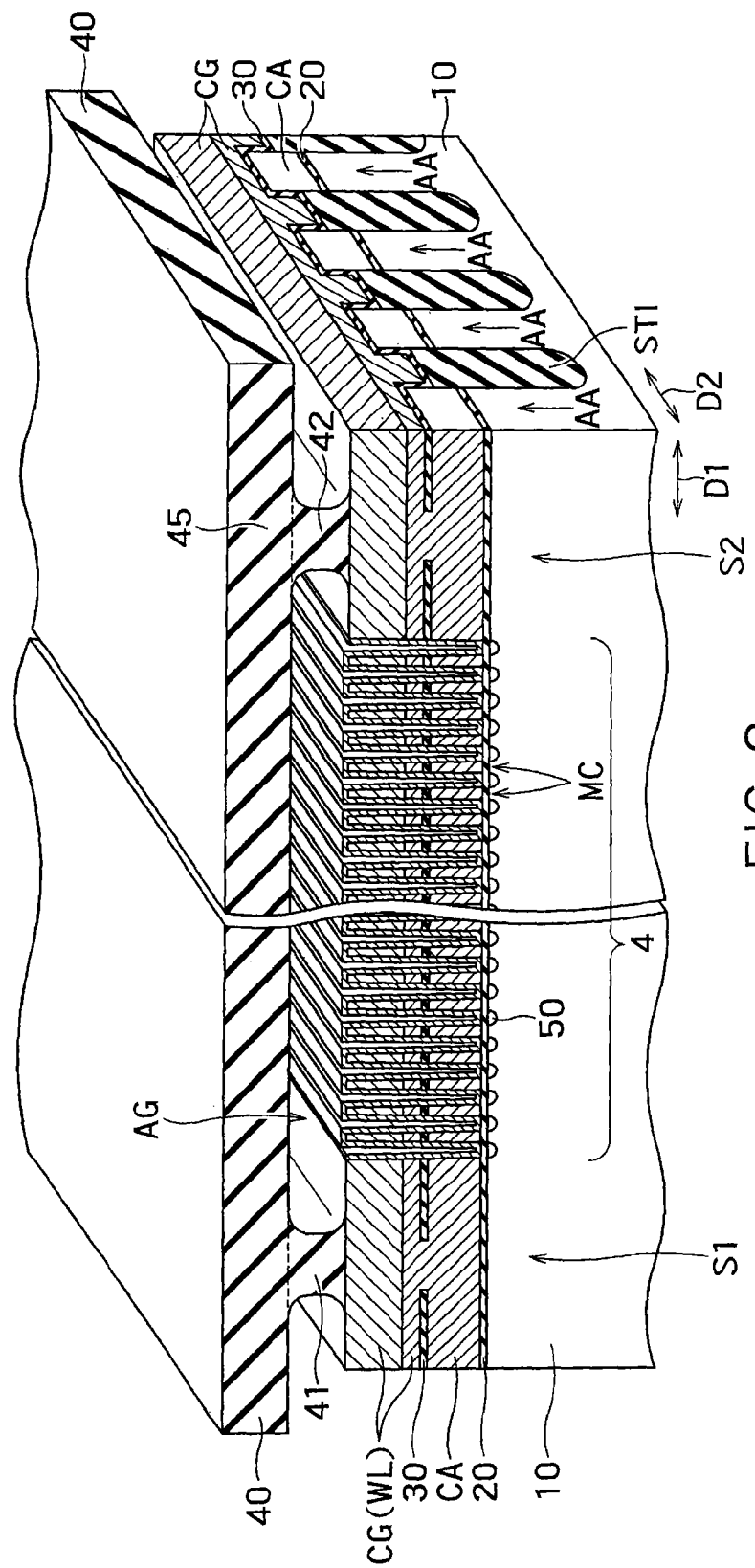
FIG. 2 is a perspective cross-sectional view showing an example of a configuration of a NAND flash memory according to the present embodiment.

FIG. 2 is a perspective cross-sectional view showing an example of a configuration of a NAND flash memory (hereinafter, also simply as "memory") according to the present embodiment. FIG. 2 shows a cross section of the memory string 4 and the select gate transistors S1 and S2 on the both ends of the memory string 4, respectively.

The memory string 4 includes a plurality of the memory cells MC connected in series by a diffusion layer 50. An array direction of the memory cells MC is a direction D1. On the both ends of the memory string 4, the select gate transistors S1 and S2 for selecting the memory string 4 are provided, respectively.

Each of the memory cells MC includes a semiconductor substrate 10, a tunnel dielectric film 20, a charge accumulation layer CA, an intergate dielectric film 30, and a control gate CG.

The semiconductor substrate 10 is, for example, a silicon substrate. The tunnel dielectric film 20 is an insulating film such as a silicon dioxide film. The charge accumulation layer CA is made of a material having a charge trapping property, such as doped polysilicon or a silicon nitride film. The intergate dielectric film 30 is made of, for example, a silicon dioxide film, a silicon nitride film, or a high dielectric material (HfSiO, for example) having a higher relative permittivity than the silicon dioxide film and the silicon nitride film. The control gate CG is made of a conductive material such as doped polysilicon, silicide, or metal.

The select gate transistors S1 and S2 each include the semiconductor substrate 10, the tunnel dielectric film 20, the charge accumulation layer CA, the intergate dielectric film 30, and the control gate CG similarly to the memory cells MC. However, in the select gate transistors S1 and S2, a part of the intergate dielectric film 30 is removed to electrically connect the control gate CG and the charge accumulation layer CA to each other to cause the control gate CG and the charge accumulation layer CA to function as an integrated gate electrode.

The memory strings 4 are arrayed in a direction D2 orthogonal to the array direction D1 of the memory cells MC. The direction D2 can be reworded as an extension direction of the control gates CG (the word lines WL). Shallow trench isolation regions STI extending in the direction D1 are provided between the memory strings 4 adjoining in the direction D2, which are electrically insulated from each other by the shallow trench isolation regions STI. Active areas AA are provided between adjacent ones of the shallow trench isolation regions STI. Elements such as the memory strings 4 and the select gate transistors S1 and S2 are formed on the active areas AA.

The memory according to the present embodiment further includes an air gap film (a first film) 40. The air gap film 40 includes pillar portions 41 and 42 provided on the select gate transistors S1 and S2, respectively, and a covering portion 45 supported by the pillar portions 41 and 42. The covering portion 45 covers above the memory strings 4 and is provided to form an air gap (a hollow) AG on the memory cells MC. The pillar portions 41 and 42 physically support the covering portion 45 to hold the air gap AG.

Accordingly, the air gap film 40 is in contact on the select gate transistors S1 and is in contact on the select gate transistors S2 while passing over the memory strings 4 without being in contact with the memory cells MC in the memory strings 4. The air gap film 40 thereby forms the air gap AG directly on the respective memory cells MC in the memory strings 4.

The air gap AG is also formed between adjacent ones of the memory cells MC in the memory strings 4. The air gap AG between the adjacent ones of the memory cells MC is communicated with the air gap AG on the memory cells MC to form an integrated air gap AG. Therefore, the air gap AG is not separated individually between the adjacent ones of the memory cells MC but is provided in common to the memory cells MC in the memory strings 4.

The air gap AG extends in the direction D2 and is communicated on the memory strings 4 arrayed in the direction D2. That is, the air gap AG is provided also in common to the memory strings 4 arrayed in the direction D2.

Meanwhile, the air gap AG is closed by the pillar portions 41 and 42 at the select gate transistors S1 and S2 as mentioned above. Therefore, the air gap AG is separated as for a plurality of the memory strings 4 adjoining in the direction D1.

Figure 3:
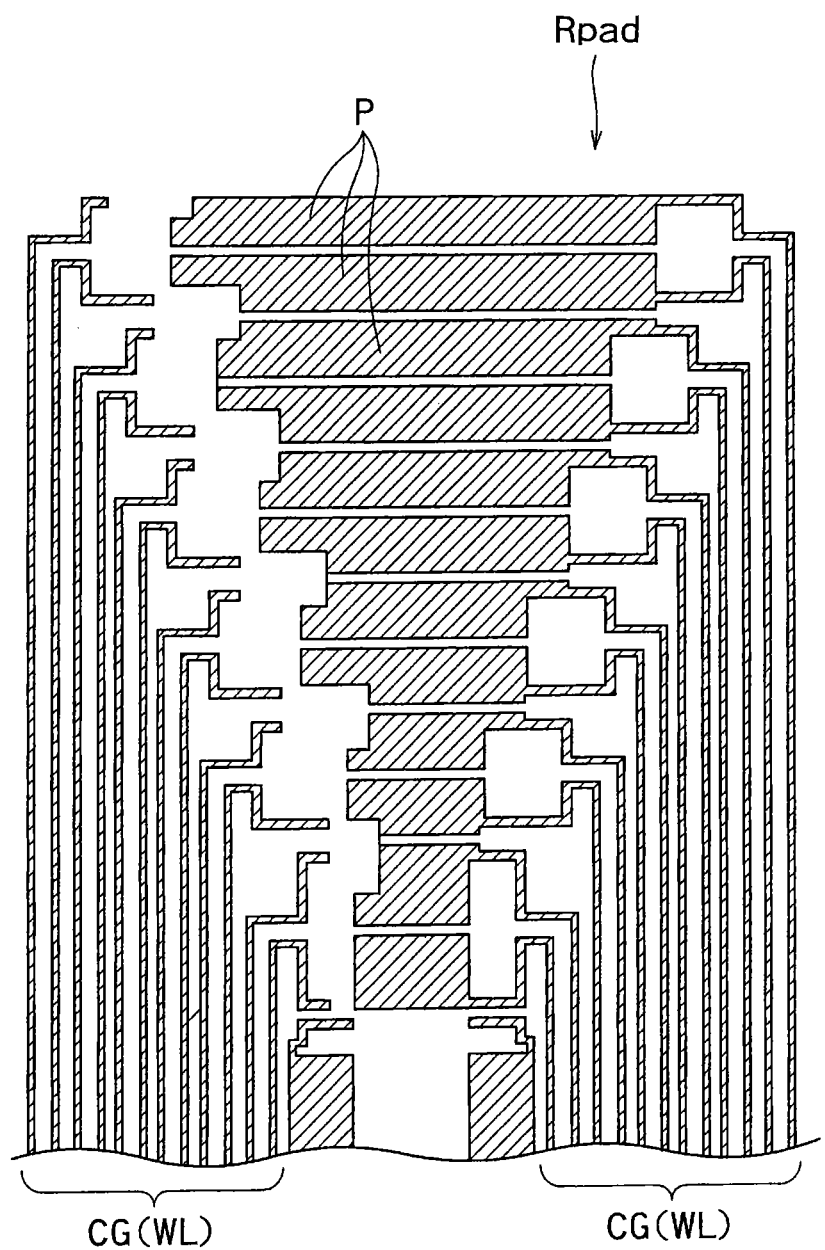
FIG. 3 is a plan view showing an example of a drawing pad formation region Rpad of the word lines WL.

The air gap AG is closed in a formation region of drawing pads for a plurality of the control gates CG (the word lines WL). For example, FIG. 3 is a plan view showing an example of a drawing pad formation region Rpad of the word lines WL. Drawing pads P for the word lines WL are provided to correspond to the control gates CG (the word lines WL), respectively, and electrically connect contact plugs (not shown) provided on the drawing pads P to the word lines WL, respectively. The drawing pad formation region Rpad extends in the direction D2 in FIG. 2 and is provided at an end of a plurality of the word lines WL shared by a plurality of the memory strings 4. The drawing pads P are formed in the same layer as that of the control gates CG (the word lines WL) and are formed wider than the word lines WL to receive the contact plugs, respectively.

Because the memory cells MC are not formed in the formation region Rpad of the drawing pads P, the air gap film 40 can be in contact on the word lines WL or the drawing pads P. The air gap film 40 is thereby physically supported at the select gate transistors S1 and S2 and the drawing pad formation region Rpad.

As described above, in the present embodiment, the air gap film 40 is not in contact with the memory cells MC in the memory strings 4 and is supported at the select gate transistors S1 and S2 and the drawing pad formation region Rpad while passing over the memory cells MC. The air gap AG is thereby held between adjacent ones of the memory cells MC and above the memory strings 4. Because the air gap film 40 is located above the memory strings 4, the air gap film 40 applies no tensile stress to the memory cells MC. Therefore, deterioration in the charge retention properties of the memory cells MC can be suppressed.

The air gap AG is also provided between adjacent ones of the memory cells MC. Therefore, the parasitic capacitance between the adjacent ones of the control gates CG (the word lines WL) can be reduced and also the withstanding pressure between the adjacent ones of the word lines WL can be enhanced.

A manufacturing method of the memory according to the present embodiment is explained next.

FIGS. 4A to 5D are cross-sectional views showing an example of the manufacturing method of the memory according to the present embodiment. FIGS. 4A to 5D show cross sections of the memory string 4 in the direction D1, respectively.

First, materials of the tunnel dielectric film 20 and the charge accumulation layer CA are sequentially formed on the semiconductor substrate 10. The semiconductor substrate 10 is, for example, a silicon substrate. The tunnel dielectric film 20 is an insulating film such as a silicon dioxide film. The tunnel dielectric film 20 is formed, for example, by thermally oxidizing the semiconductor substrate 10. The charge accumulation layer CA is made of a conductive material such as doped polysilicon. The charge accumulation layer CA is deposited on the tunnel dielectric film 20 using, for example, a CVD (Chemical Vapor Deposition) method.

After formation of the charge accumulation layer CA, trenches extending in the direction D1 shown in FIG. 2 are formed and a silicon dioxide film is filled in the trenches. The shallow trench isolation regions STI are thereby formed. Formation of the shallow trench isolation regions STI defines the active areas AA.

Next, materials of the intergate dielectric film 30 and the control gates CG are sequentially formed on the charge accumulation layer CA. The intergate dielectric film 30 is made of, for example, a silicon dioxide film, a silicon nitride film, or a high dielectric material (HfSiO, for example) having a higher relative permittivity than the silicon dioxide film and the silicon nitride film. The intergate dielectric film 30 is deposited on the tunnel dielectric film 20 also using, for example, the CVD method. The intergate dielectric film 30 is partially removed between the control gates CG and the charge accumulation layer CA to electrically connect the control gates CG and the charge accumulation layer CA to each other at the select gate transistors S1 and S2. The control gates CG are made of, for example, a conductive material such as doped polysilicon or metal.

Figure 4A:
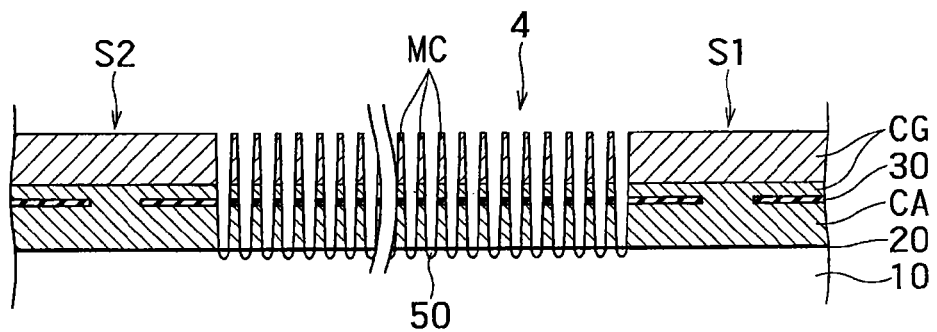
FIGS. 4A to 5D are cross-sectional views showing an example of the manufacturing method of the memory according to the present embodiment.

Next, the control gates CG, the intergate dielectric film 30, and the charge accumulation layer CA are processed using a lithography technique or a sidewall transfer method and a RIE (Reactive Ion Etching) method. Gate structures (the control gates CG, the intergate dielectric film 30, and the charge accumulation layer CA) of the memory cells MC and gate electrodes of the select gate transistors S1 and S2 are thereby separated from each other as shown in FIG. 4A.

After a silicon dioxide film (not shown) is deposited on the gate structures of the memory cells MC, impurity ions are implanted into the semiconductor substrate 10 using the gate structures of the memory cells MC as a mask. Thermal treatment is then performed, thereby forming the diffusion layer 50 as shown in FIG. 4A. The memory strings 4 and the select gate transistors S1 and S2 are thereby formed on the semiconductor substrate 10.

Figure 4B:
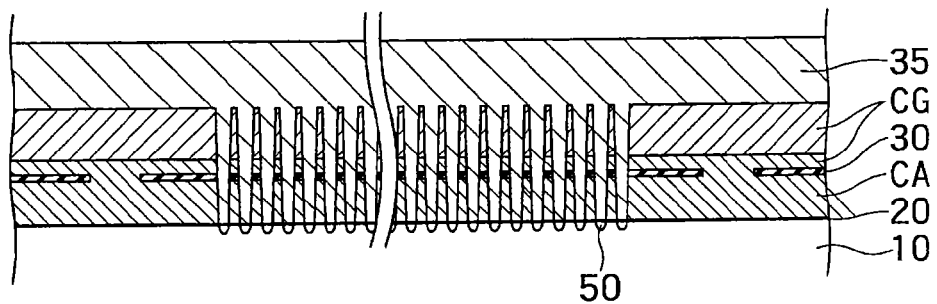

Next, as shown in FIG. 4B, a sacrifice film 35 is applied between adjacent ones of the memory cells MC and on the memory cells MC. The sacrifice film 35 is made of, for example, a TDP (Thermal Degradable Polymer). For example, a material that sublimates at a temperature of about 400 degrees is selected as the TDP.

Figure 4C:
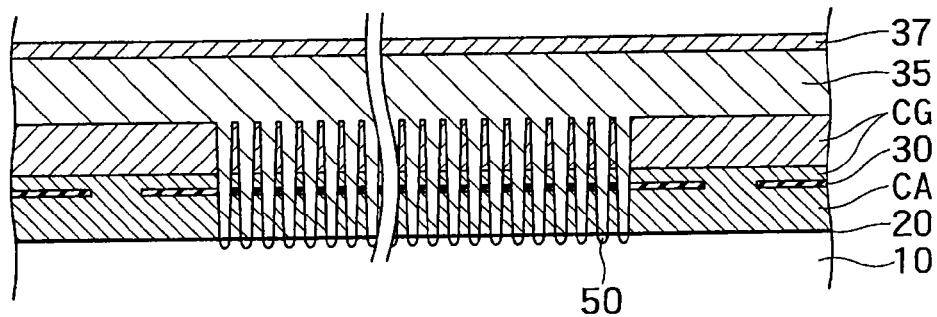

A silicon dioxide film 37 is then deposited on the sacrifice film 35 using a low-temperature ALD (Atomic Layer Deposition) method as shown in FIG. 4C. At that time, the silicon dioxide film 37 is deposited at a temperature (equal to or lower than 400 degrees, for example) at which the sacrifice film 35 does not sublimate. The silicon dioxide film 37 functions as a hard mask during processing of the sacrifice film 35.

Figure 4D:
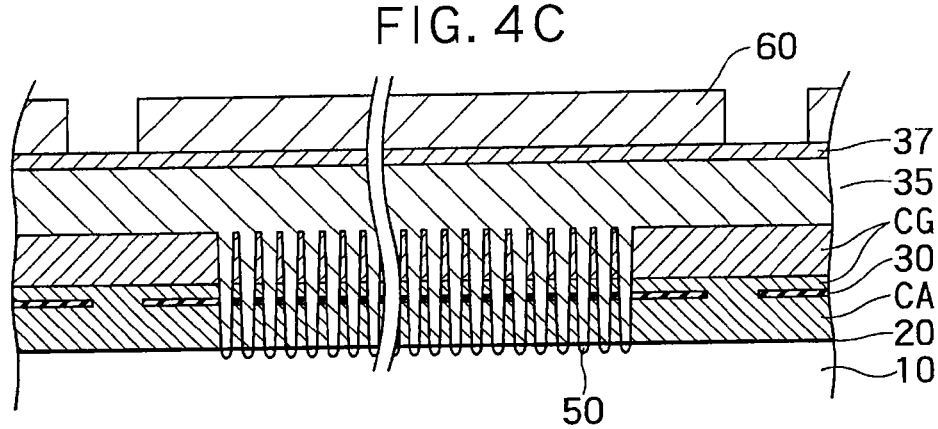

Next, an antireflection film (not shown) is formed on the sacrifice film 35 and then a resist 60 is formed on the silicon dioxide film 37 using the lithography technique as shown in FIG. 4D. At that time, the resist 60 is patterned to open formation regions of the pillar portions 41 and 42 and the drawing pad formation region Rpad shown in FIGS. 2 and 3.

Next, the silicon dioxide film 37 is processed by a RIE method using the resist 60 as a mask. The sacrifice film 35 is then processed by the RIE method using the silicon dioxide film 37 as a mask. The resist 60 is then removed, thereby obtaining a structure shown in FIG. 5A. At that time, the sacrifice film 35 covers between adjacent ones of the memory cells MC, on the memory cells MC, and on parts of the select gate transistors S1 and S2. Meanwhile, the sacrifice film 35 located in the formation regions of the pillar portions 41 and 42 on upper surfaces of the select gate transistors S1 and S2 and in the drawing pad formation region Rpad is removed.

Figure 5A:
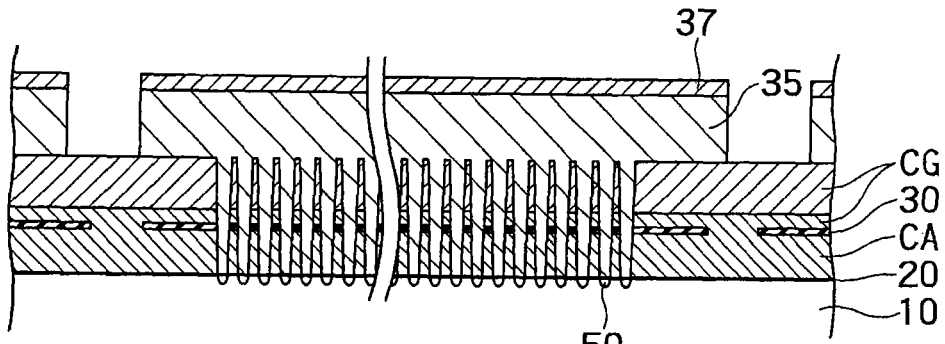
Figure 5B:
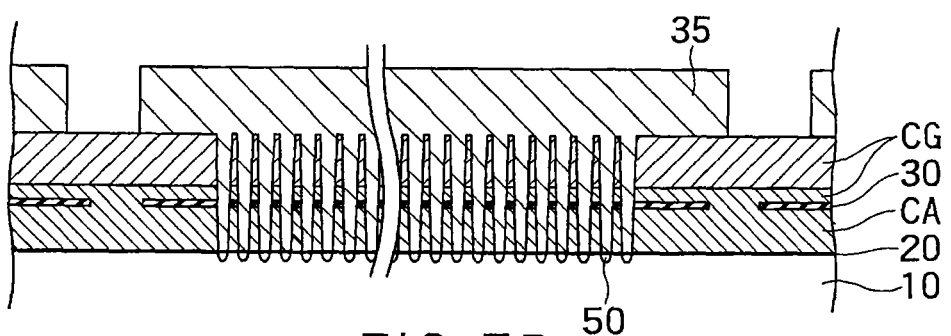

Next, the silicon dioxide film 37 is removed by a wet etching method as shown in FIG. 5B.

Figure 5C:
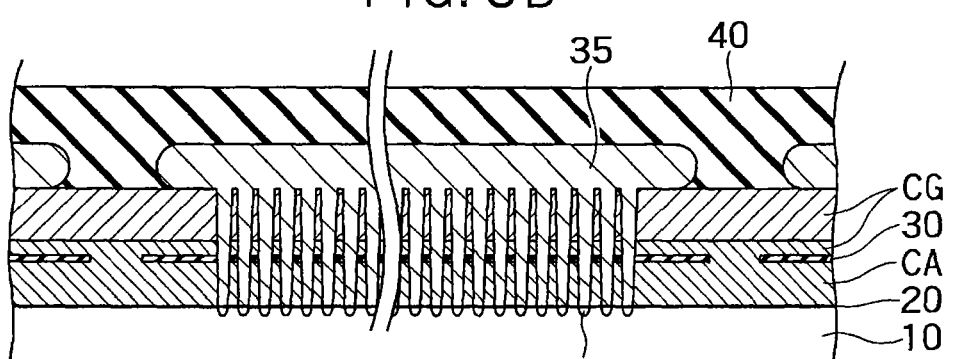
Figure 5D:
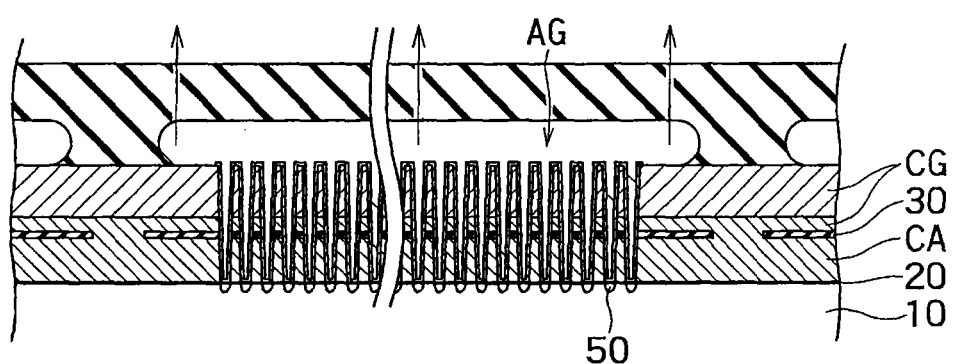

The air gap film 40 is then deposited on the sacrifice film 35 using a PECVD (Plasma Enhanced CVD) method as shown in FIG. 5C. At that time, the air gap film 40 is formed at a temperature lower than a sublimation temperature of the sacrifice film 35 (at a temperature equal to or lower than about 400 degrees, for example). The air gap film 40 is an insulating film such as a silicon dioxide film and is formed of a material having a sublimation temperature or a melting point lower than that of the sacrifice film 35. The air gap film 40 is preferably formed of a non-dense material (porous S102, for example) to facilitate sublimation of the sacrifice film 35 at a subsequent thermal treatment step. However, in view of the leak and the polishing resistance, it is preferable that the air gap film 40 be a non-porous material.

Next, thermal treatment is performed at a temperature higher than the sublimation temperature of the sacrifice film 35 (at a temperature higher than about 400 degrees, for example). The sacrifice film 35 thereby sublimates and diffuses outside through the air gap film 40. That is, the sacrifice film 35 is removed with the air gap film 40 left remained. When the sacrifice film 35 is sublimated, the air gap (the hollow) AG is formed under the air gap film 40. When the entire sacrifice film 35 provided between adjacent ones of the memory cells MC and on the memory cells MC is sublimated, the air gap AG is formed between the adjacent ones of the memory cells MC and on the memory cells MC.

Meanwhile, the air gap film 40 is bridged between the select gate transistor S1 and the select gate transistor S2 and is in contact on the control gates CG in the drawing pad formation region Rpad. Accordingly, the air gap film 40 can be physically supported at the select gate transistors S1 and S2 and the drawing pad formation region Rpad while forming the air gap AG between the memory cells MC and on the memory cells MC.

An interlayer dielectric film is then deposited and contacts, wires, and the like are formed, whereby the memory according to the present embodiment is completed.

According to the present embodiment, the memory including the air gap AG between adjacent ones of the memory cells MC and above the memory strings 4 can be formed. The air gap AG is held between the adjacent ones of the memory cells MC and above the memory strings 4. Because the air gap AG is located above the memory strings 4, the air gap film 40 applies no tensile stress to the memory cells MC. Therefore, deterioration in the charge retention properties of the memory cells MC can be suppressed. Furthermore, by providing the air gap AG between adjacent ones of the memory cells MC, the parasitic capacitance between the adjacent ones of the word lines WL can be reduced and the withstanding pressure between the adjacent ones of the word lines WL can be enhanced.

In the present embodiment, the cross section of the word lines WL can be specified according to the shapes of the air gap AG and the air gap film 40 as seen with an SEM (Scanning Electron Microscope) or a TEM (Transmission Electron Microscope).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
   a semiconductor substrate;
   a plurality of memory cells on the semiconductor substrate; and
   a first film above the memory cells to form air gaps above a memory string in which the memory cells are connected in series, wherein
   the air gaps are also provided between adjacent ones of the memory cells,
   the air gaps are communicated with each other between adjacent ones of the memory cells in the memory string and on the memory cells in the memory string, and
   the air gaps are closed at portions on select gate transistors on both ends of the memory string.

2. The device of claim 1, wherein
the device further comprises a plurality of select gate transistors on both ends of the memory string, respectively, and
the first film is in contact with the select gate transistor on one end of the memory string and is in contact with the select gate transistor on other end of the memory string while passing over the memory string without being in contact with the memory cells.

3. The device of claim 1, wherein
a plurality of the memory strings are arrayed in a direction orthogonal to an array direction of the memory cells, and
the air gaps extend in an array direction of the memory strings and are communicated on the memory strings.

4. The device of claim 2, wherein
a plurality of the memory strings are arrayed in a direction orthogonal to an array direction of the memory cells, and
the air gaps extend in an array direction of the memory strings and are communicated on the memory strings.

5. The device of claim 1, wherein
a plurality of the memory strings are arrayed in a direction orthogonal to an array direction of the memory cells, and
the air gaps are closed in a drawing pad formation region of a plurality of word lines shared by the memory strings.

6. The device of claim 2, wherein
a plurality of the memory strings are arrayed in a direction orthogonal to an array direction of the memory cells, and
the air gaps are closed in a drawing pad formation region of a plurality of word lines shared by the memory strings.

* * * * *